US00RE41880E

(19) United States
(12) Reissued Patent
Hashimoto et al.

(10) Patent Number: US RE41,880 E
(45) Date of Reissued Patent: Oct. 26, 2010

(54) SEMICONDUCTOR MEMORY DEVICE

(75) Inventors: Kiyokazu Hashimoto, Kanagawa (JP); Hiroshi Furuta, Kanagawa (JP)

(73) Assignee: NEC Electronics Corporation, Kawasaki (JP)

(21) Appl. No.: 11/657,380

(22) Filed: Jan. 24, 2007

Related U.S. Patent Documents

Reissue of:
(64) Patent No.: 6,847,561
Issued: Jan. 25, 2005
Appl. No.: 10/652,920
Filed: Aug. 28, 2003

(30) Foreign Application Priority Data

Aug. 28, 2002 (JP) ..... 2002-249388

(51) Int. Cl.
*G11C 7/06* (2006.01)

(52) U.S. Cl. ..... 365/189.07; 265/210.1; 265/233.5; 265/236

(58) Field of Classification Search ..... 365/189.07, 365/210.1, 185.2
See application file for complete search history.

(56) References Cited

U.S. PATENT DOCUMENTS

| | | | | | |
|---|---|---|---|---|---|
| 5,596,526 | A | * | 1/1997 | Assar et al. | 365/185.17 |
| 5,815,449 | A | * | 9/1998 | Taura | 365/189.07 |
| 6,510,093 | B1 | * | 1/2003 | Dhong et al. | 365/210.1 |
| 6,690,606 | B2 | * | 2/2004 | Lovett et al. | 365/233.5 |
| 6,809,976 | B2 | | 10/2004 | Ooishi | |
| 2004/0017718 | A1 | | 1/2004 | Ooishi | |

FOREIGN PATENT DOCUMENTS

| | | |
|---|---|---|
| JP | 3-34195 | 2/1991 |
| JP | 9-231775 | 9/1997 |
| JP | 11-144474 | 5/1999 |
| JP | 11-185481 | 7/1999 |
| JP | 2000-30474 | 1/2000 |
| JP | 2000-268558 | 9/2000 |
| JP | 2001-006378 | 1/2001 |
| JP | 2001-250374 | 9/2001 |
| JP | 2002-015562 | 1/2002 |
| JP | 2002-015563 | 1/2002 |
| JP | 2003-288781 | 10/2003 |
| JP | 2004-62922 | 2/2004 |

OTHER PUBLICATIONS

Japanese Office Action dated Dec. 4, 2007, from the corresponding Japanese Application, with partial translation.
Japanese Office Action dated Jul. 22, 2008, from the corresponding Japanese Application, with partial translation.

* cited by examiner

*Primary Examiner*—Huan Hoang
(74) *Attorney, Agent, or Firm*—Katten Muchin Rosenman LLP

(57) ABSTRACT

A semiconductor memory device includes (a) a plurality of reference cells, (b) a plurality of memory cells, data stored in a selected reference cell among the reference cells being compared to data stored in a selected memory cell among the memory cells, (c) an address transition detector for detecting transition in input of addresses by which a memory cell is selected among the memory cells, and transmitting an address transition detecting signal indicative of the detected transition, (d) a counter for counting the address transition detecting signals, and (e) a reference cell decoder for selecting a reference cell among the reference cells in accordance with an output transmitted from the counter.

24 Claims, 11 Drawing Sheets

SEMICONDUCTOR MEMORY DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to a semiconductor memory device, and more particularly to a semiconductor memory device which includes a plurality of reference cells and which is capable of preventing degradation of the reference cells by switching the reference cells one by one.

2. Description of the Related Art

In a semiconductor memory device such as a flash memory (for instance, a flash electrically erasable and programmable read only memory (EEPROM)) or a ferroelectric memory (for instance, FeRAM), data stored in a selected memory cell is compared to data stored in a reference cell for carrying out desired function.

FIG. 1 is a conventional semiconductor memory device comprised of a flash EEPROM having 16 Mbit. Hereinbelow is explained a structure of the conventional semiconductor memory device with reference to FIG. 1.

As illustrated in FIG. 1, the semiconductor memory device is comprised of a first address buffer 11, a second address buffer 12, an address-transition detecting (ATD) circuit 13, a signal generating circuit 14, a Y-decoder 15, a X-decoder 16, a Y-selector 17, a memory cell array 10, a sense amplifier 18, a reference amplifier 19, a comparator-amplifier 20, an output buffer 21, a reference cell MRD, and a reference cell selector QR1.

The first address buffer 11 receives an address signal Ai (i=0 to 9), and transmits an internal address signal Adi (i=0 to 9) to the ATD circuit 13 and the Y-decoder 15. The second address buffer 12 receives an address signal Ai (i=10 to 19), and transmits an internal address signal Adi (i=10 to 19) to the ATD circuit 13 and the X-decoder 16.

On receipt of the internal address signals Adi from the first and second address buffers 11 and 12, the ATD circuit 13 detects variance in the address signals, and transmits an address-transition detecting signal P0 in the form of a one-shot pulse to the signal generating circuit 14.

The signal generating circuit 14 receives the address-transition detecting signal P0 from the ATD circuit 13, and transmits a control signal P1 in the form of a one-shot pulse to the sense amplifier 18 and the reference amplifier 19. Operation of the sense amplifier 18 and the reference amplifier 19 is controlled by the control signal P1.

The X-decoder 16 decodes the received internal address signals Ad10 to Ad19 for selecting a word line. The X-decoder 16 transmits its output signal to one of word lines W0 to Wm for selecting a word line. A voltage VR is applied to the selected word line.

The Y-decoder 15 decodes the received internal address signals Ad0 to Ad9 for selecting a digit line. The Y-decoder 15 transmits its output signal to one of Y-select lines Y0 to Yn for selecting a Y-select line. A voltage VY is applied to the selected Y-select line.

The memory cell array 10 includes a plurality of memory cells MC00 to MCnm arranged in a matrix. An output signal W0 to Wm transmitted from the X-decoder 16 is input into a gate of an associated memory cell of the memory cell array 10. A drain in each of memory cells is electrically connected to an associated digit line D0 to Dn, and a source in each of memory cells is electrically connected to a node CS. The node CS to which sources of the memory cells is electrically connected is kept at a ground voltage by a circuit (not illustrated) when data is read out of a memory cell.

The Y-selector 17 is comprised of MOSFETs QY0 to QYn each having a source electrically connected to each of digit lines D0 to Dn, a drain electrically connected to an input node SC through which the Y-selector 17 is electrically connected to the sense amplifier 18, and a gate electrically connected to each of output lines Y0 to Yn through which the Y-decoder 15 transmits its output signal to the Y-selector 17.

The sense amplifier 18 amplifies a voltage of a selected memory cell.

The reference cell MRD has a drain electrically connected to a node DR, a gate electrically connected to a reference cell selection signal line XR, and a source electrically connected to a node RS. The reference cell MRD has the same structure and characteristics as those of a memory cell arranged in the memory cell array 10. The node RS is kept at a ground (GND) voltage by a circuit (not illustrated) when data is read out of a selected memory cell.

The reference selector QR1 is comprised of a MOSFET having a drain electrically connected to a node RC through which the reference selector QR1 is electrically connected to the reference amplifier 19, a gate electrically connected to a reference cell selection signal line YR, and a source electrically connected to the node DR.

The voltages VR and VY are applied to the reference cell selection signal line XR and the reference cell selection signal line YR, respectively, when data is read out of a selected memory cell.

The reference amplifier 19 amplifies a voltage of the reference cell MRD.

The comparator-amplifier 20 amplifies a voltage difference between an output SA transmitted from the sense amplifier 18 and an output RA transmitted from the reference amplifier 19. The comparator-amplifier 20 judges whether a selected memory cell is in data-writing condition (0) or in data-erasing condition (1).

The output buffer 21 receives an output transmitted from the comparator-amplifier 20, and outputs data about a memory cell to an external data bus through an external output terminal I/O 0.

The semiconductor memory device illustrated in FIG. 1 actually has sixteen external output terminals I/O 0 to I/O 15 when the semiconductor memory device is designed to transmit a 16-bit output, for instance, and has sixteen sense amplifiers, memory cell arrays and comparator-amplifiers, accordingly. However, FIG. 1 illustrates only the external output terminal I/O 0 and its associated parts, and other external output terminals I/O 1 to I/O 15 and their associated parts are omitted for simplification. In addition, a control system and a power source system are omitted, because they have nothing to do with the present invention.

FIG. 2 illustrates waveforms of signals used for operating the conventional semiconductor memory device illustrated in FIG. 1. Symbols in FIG. 2 correspond to the nodes and signals illustrated in FIG. 1.

Hereinbelow is explained an operation of the semiconductor memory device on the assumption that a memory cell MC00 is selected for reading data out thereof.

In accordance with variance in the external address signal Ai, a word line W0 is selected, and thus, has a H level. The voltage VR is applied to the selected word line W0.

Similarly, a Y-select line Y0 is selected, and thus, has a H 1 level. The voltage VY is applied to the selected Y-select line Y0. As a result, the memory cell MC00 is selected.

In addition, in accordance with variance in the internal address signals Adi, the ATD circuit 13 transmits the address transition detecting signal P0 to the signal generating circuit 14, and then, the signal generating circuit 14 transmits the control signal P1 to the sense amplifier 18 and the reference amplifier 19 to thereby activate them.

Herein, it is assumed that a memory cell has a threshold voltage of 7V in the data-writing condition (0) and a threshold voltage of 2V in the data-erasing condition (1), and a reference cell has a threshold voltage of 3.4V. Data is read out of the selected memory cell MC00 as follows.

If the memory cell MC00 is in the data-writing condition (0), the memory cell MC00 does not allow a current to run therethrough, and resultingly, a voltage of the output SA transmitted from the sense amplifier 18 is lowered to a balanced voltage VSA(0) from an initial voltage V(ini), as shown with a waveform of a voltage SA(0).

On the other hand, the reference cell MRD allows a current to slightly run therethrough, and resultingly, a voltage of the output RA transmitted from the reference amplifier 19 is lowered to a balanced voltage VRA(i) from the initial voltage V(ini), as shown with a waveform of a voltage RA(i).

A voltage difference between the voltages VSA(O) and VRA(i) is amplified in the comparator-amplifier 20, and then, data stored in the memory cell is checked.

The comparator-amplifier 20 transmits its output to the output buffer 21, and the output buffer 21 transmits an output signal having a L level to an external output terminal I/Oi, as shown with a waveform of a voltage I/O 0(0).

If the selected memory cell MC00 is in the data-erasing condition (1), the memory cell MC00 allows a current to run therethrough, and resultingly, a voltage of the output SA transmitted from the sense amplifier 18 is lowered to a balanced voltage VSA(1) from the initial voltage V(ini), as shown with a waveform of a voltage SA(1).

On the other hand, the reference cell MRD allows a current to slightly run therethrough, and resultingly, a voltage of the output RA transmitted from the reference amplifier 19 is lowered to a balanced voltage VRA(i) from the initial voltage V(ini), as shown with a waveform of a voltage RA(i).

A voltage difference between the voltages VSA(1) and VRA(i) is amplified in the comparator-amplifier 20, and then, data stored in the memory cell is checked.

The comparator-amplifier 20 transmits its output to the output buffer 21, and the output buffer 21 transmits an output signal having a H level to an external output terminal I/Oi, as shown with a waveform of a voltage I/O 0(1).

As explained above, a H- or L-level signal is output to an external output terminal in accordance with a threshold level of a memory cell, and thus, data is read out of the semiconductor memory device.

In the conventional semiconductor memory device illustrated in FIG. 1, the 10-bit address signal Ai having addresses A10 to A19 is transmitted to the X-decoder 16. Hence, the X-decoder 16 has 1024 word lines ($2^{10}$=1024, "m" in FIG. 1 is equal to 1023). Accordingly, when data is read out of the memory cells in order, a time during which a voltage is applied to a word line is equal to 1/1024 of a time necessary for reading data out of all of the memory cells.

The reference cell MRD is always selected during data is read out of a memory cell regardless of which word line in the memory cell array 10 is selected, and hence, a voltage equal to the voltage VR applied to a selected word line is kept applied to the reference cell selection signal line XR of the reference cell MRD.

It is well known that a memory cell in a flash EEPROM is degraded after reading data out of the memory cell for a long time. It is obvious that a reference cell which is kept in a selected condition is first degraded, since a gate of the reference cell is biased by the data-reading voltage VR during data is read out of a memory cell.

The waveform RA(a) in FIG. 2 is a waveform of a reference voltage VR found after data-reading operation has been carried out for a long time (for instance, five years). As a result of carrying out data-reading operation long time, a reference cell is degraded, a current running therethrough is reduced. In addition, an initial voltage VRA(i) is raised up to a voltage VRA(a), resulting in that a gap between the voltages VRA(i) and VRA(a) is quite small. Thus, the comparator-amplifier 20 may wrongly operate. Specifically, as shown with a waveform I/O 0(0)a, a L-level voltage is not output to the external output terminal I/O 0, but a H-level voltage may be output to the external output terminal I/O 0.

As explained above, the conventional semiconductor memory device is accompanied with a problem that the reference cell MRD receives much stress in data-reading operation in comparison with the memory cells in the memory cell array 10, because the conventional semiconductor memory device is designed to include a single reference cell.

As a solution to the problem, Japanese Patent Application Publication No. 2001-250374 has suggested a semiconductor memory device which switches a reference cell to another in accordance with the number of operation of a reference cell. The suggested device is necessary to include at least a circuit for monitoring the number of operation of a reference cell, a circuit for detecting variance in characteristics of a reference cell, and a circuit for switching a dummy cell to a memory cell. As a result, the semiconductor memory device is unavoidably complicated in circuit structure, big in size, and high in cost.

Japanese Patent Application Publication No. 9-231775 has suggested a semiconductor memory device including a reference cell decoder for selecting a reference cell. However, a detailed structure of the reference cell decoder is not disclosed.

As mentioned above, a conventional semiconductor memory device including a reference cell for reading data out of, writing data into or erasing data out of a memory cell is accompanied with a problem of variance in characteristics of a reference cell. To solve such a problem, a semiconductor memory device has to include a lot of additional circuits, resulting in a problem of an increase in a size of a semiconductor memory device.

Japanese Patent Application Publication No. 11-144474 has suggested a non-volatile memory device including (a) a memory array including a plurality of memory cells each having a word line, a bit line, a cell electrode line associated with the word line, a ferroelectric capacitor, and a switching transistor, the ferroelectric capacitor having a first electrode electrically connected to an associated bit line through an associated switching transistor, and a second electrode electrically connected to an associated cell electrode line, the switching transistor having a control electrode electrically connected to an associated word line, (b) a detecting circuit receiving a level associated with a data bit of a selected memory cell, and a reference level defined as an average level of levels of associated data bits, and detecting a level of the selected data bit, and (c) a reference cell array including a plurality of reference cells each associated with each of the bit lines, and providing the reference level, the reference cell including at least one redundant cell associated with the bit line so that when the reference level is biased in one direction, the thus biased reference level is compensated for.

Japanese Patent Application Publication No. 11-185481 has suggested a semiconductor memory device including two pairs of bit lines. In each of pairs, variance in a voltage is generated in one of bit lines by means of data stored in a memory cell, and a reference voltage is generated in the other of bit lines by means of data stored in a reference cell. The two reference cells in each of pairs are electrically connected to each other through at least one transistor.

Japanese Patent Application Publication No. 2000-268558 has suggested a non-volatile ferroelectric memory device in which the number by which access is made to a main cell is made equal to the number by which access is made to a reference cell for lengthening a lifetime of the memory device.

Japanese Patent Application Publication No. 2001-6378 has suggested a semiconductor integrated circuit device including a non-volatile memory, a first register which reads data used for compensating for a reference voltage, out of the non-volatile memory, and stored the thus read-out data therein, a first circuit for compensating for a resistance thereof in accordance with the data stored in the first register, a second circuit for varying an output voltage in accordance with the resistance of the first circuit, and a control circuit for controlling operation of the non-volatile memory and the first register.

Japanese Patent Application Publication No. 2002-15562 has suggested a semiconductor memory device comprised of a one-transistor-and-one-capacitor type ferroelectric memory including a plurality of memory cells and a plurality of reference cells. Each of the reference cells is arranged separately from one another in association with each of the memory cells electrically connected to a common bit line. Each of the memory cells and each of the reference cells associated with each of the memory cells co-own a word line and a cell plate line.

Japanese Patent Application Publication No. 2002-15563 has suggested a circuit for generating a reference voltage in a ferroelectric memory including a ferroelectric capacitor as a memory cell. A plurality of reference memory cells each including a ferroelectric capacitor and a switch is electrically connected to a common reference bit line. Among the plurality of reference memory cells, first logic data is written into the predetermined number of the reference memory cells, and second logic data different from the first logic data is written into the rest of the reference memory cells. A reference voltage is generated in the reference bit line by selecting all of the reference memory cells.

SUMMARY OF THE INVENTION

In view of the above-mentioned problems in the conventional semiconductor memory device, it is an object of the present invention to provide a semiconductor memory device which is capable of reducing or eliminating variance in characteristics of a reference cell without necessity of a lot of additional circuits.

In one aspect of the present invention, there is provided a semiconductor memory device including (a) a plurality of reference cells, (b) a plurality of memory cells, data stored in a selected reference cell among the reference cells being compared to data stored in a selected memory cell among the memory cells, (c) an address transition detector for detecting transition in input of addresses by which a memory cell is selected among the memory cells, and transmitting an address transition detecting signal indicative of the detected transition, (d) a counter for counting the address transition detecting signals, and (e) a reference cell decoder for selecting a reference cell among the reference cells in accordance with an output transmitted from the counter.

The semiconductor memory device may further include a control signal generator which transmits a control signal to the counter, the control signal having a first logic level when the control signal generator receives the address transition detecting signal from the address transition detector, and a second logic level at a time at which a reference word line is to be activated.

It is preferable that the selected reference cell is compared to the selected memory cell for checking data when data is read out of, written into or erased out of the memory cell, and at least one reference cell is selected among the reference cells every predetermined number of times of comparison of the selected reference cell to the selected memory cell.

It is preferable that the plurality of reference cells is arranged for each of memory cell arrays or for a plurality of memory cell arrays.

The semiconductor memory device may further include a device for allowing the reference cells to have desired electrical property.

It is preferable that the electrical property includes a threshold voltage, an on-current, an off-current, an on-resistance, an off-resistance, an inverted threshold magnetic field and polarization of the reference cell.

It is preferable that the counter includes a plurality of stages each transmitting an output signal by which a reference cell is selected among the plurality of reference cells.

The semiconductor memory device may further include a circuit including a metal oxide semiconductor field effect transistor (MOSFET), and wherein a current running through the circuit is checked for allowing a common current to run through the reference cells.

The semiconductor memory device may further include a circuit including a memory device having the same threshold as that of the reference cells for adjusting threshold of the reference cells.

It is preferable that the semiconductor memory device is comprised of a ferroelectric memory device, and the memory cells and the reference cells are comprised of ferroelectric capacitors and selectively controlled MOSFETs, respectively.

It is preferable that the semiconductor memory device includes a plurality of blocks one of which is selected in accordance with a received address signal.

For instance, the semiconductor memory device may be comprised of a flash electrically erasable and programmable read only memory (EEPROM).

For instance, the semiconductor memory device may be comprised of a MONOS memory.

For instance, the semiconductor memory device may be comprised of a MRAM.

In another aspect of the present invention, there is provided a method of selecting a reference cell among a plurality of reference cells in a semiconductor memory device including a plurality of memory cells and a plurality of reference cells, including detecting transition in input of addresses by which a memory cell is selected among the memory cells, and transmitting a pulse each time of detection, counting the pulses, and selecting a desired reference cell among the reference cells in accordance with the number of the pulses.

The advantages obtained by the aforementioned present invention will be described hereinbelow.

The semiconductor memory device in accordance with the present invention is designed to include a plurality of reference cells, and switch them every predetermined access cycle, ensuring that a stress which an electric field exerts on the reference cells can be averaged and hence reduced.

Accordingly, the present invention can prevent degradation in characteristics of the reference cells, and hence, present a semiconductor memory device having high reliability. In addition, such a semiconductor memory device can be fabricated in a simple circuit structure, ensuring reduction in fabrication costs. Furthermore, the present invention can be widely used, because it can be applied to any semiconductor memory device which confirms data stored in a memory cell, by comparing data stored in a memory cell to data stored in a reference cell.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
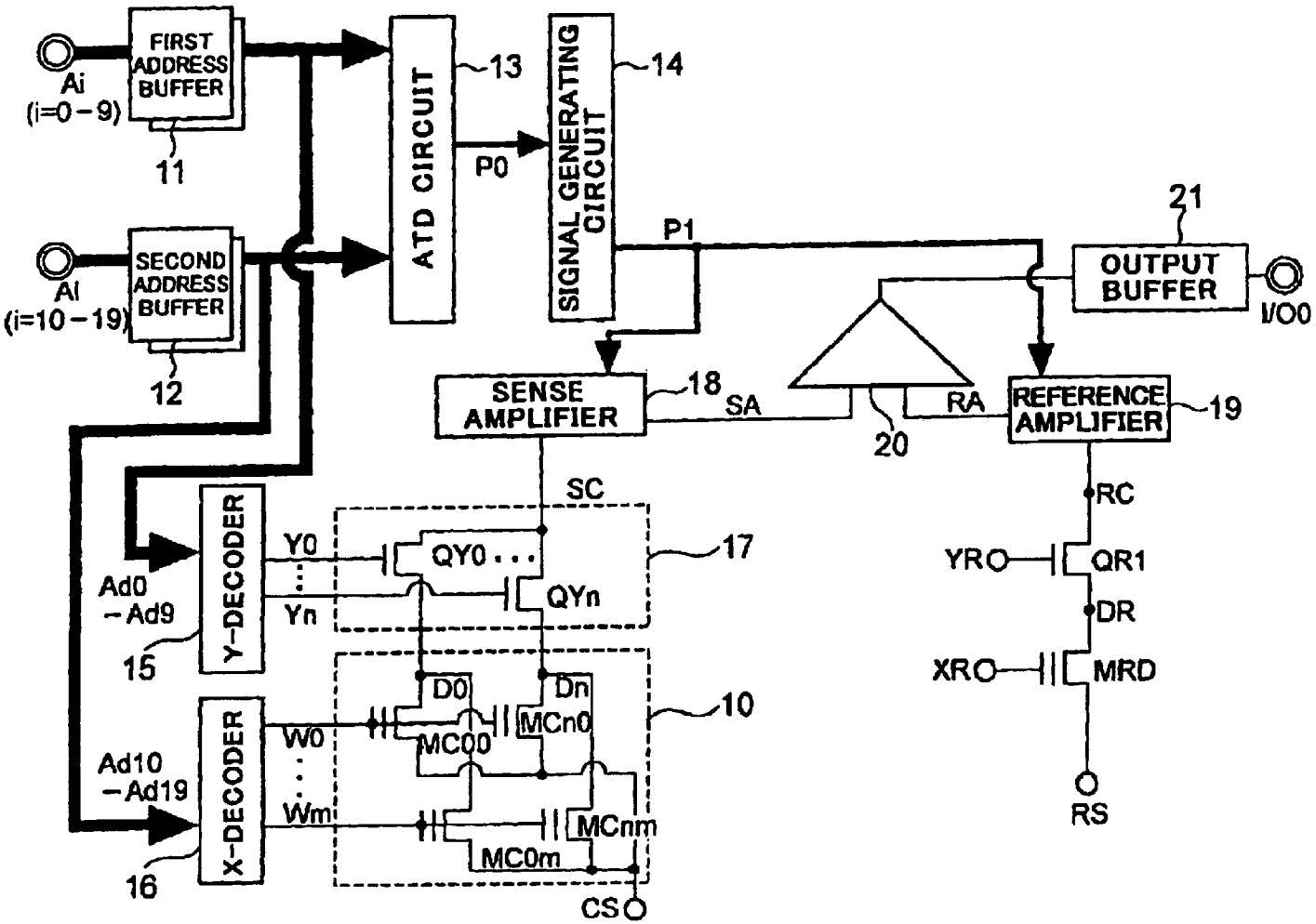
FIG.1 PRIOR ART
FIG. 1 is a block diagram of a conventional semiconductor memory device.
Figure 2:
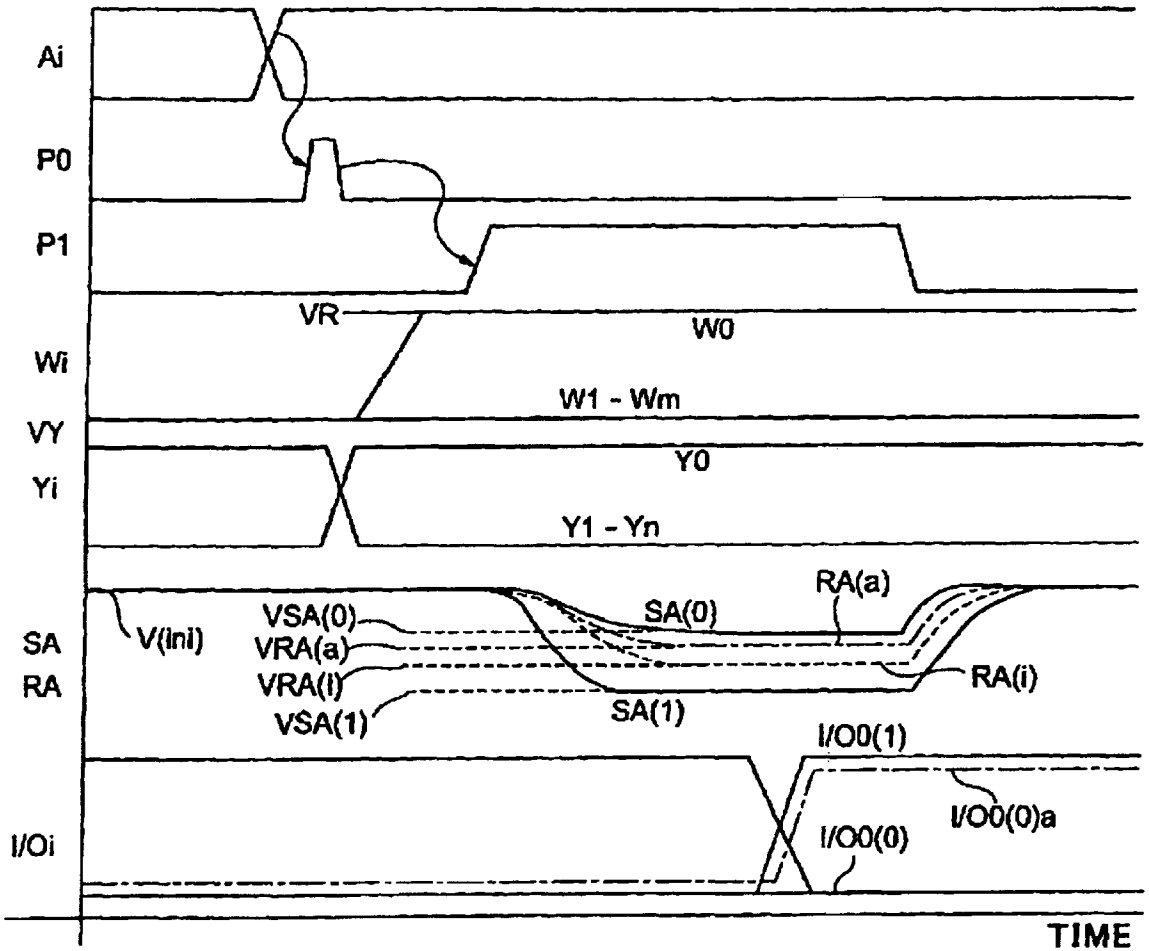
FIG.2 PRIOR ART
FIG. 2 illustrates waveforms of signals used for operating the conventional semiconductor memory device illustrated in FIG. 1.

FIG. 1 is a block diagram of a semiconductor memory device in accordance with the first embodiment of the present invention. Parts or elements that correspond to those of the conventional semiconductor memory device illustrated in FIG. 1 have been provided with the same reference numerals. The semiconductor memory device in accordance with the first embodiment is comprised of a 16-Mbit flash EEPROM.

With reference to FIG. 1, the semiconductor memory device is comprised of a first address buffer 11 receiving an address signal Ai (i=0 to 9) through an external address terminal, a second address buffer 12 receiving an address signal Ai (i=10 to 19) through an external address terminal, an address-transition detecting (ATD) circuit 13 detecting variance in address signals, a first signal-generating circuit 14, a second signal-generating circuit 101, a counter circuit 102, a Y-decoder 15, a X-decoder 16, a memory cell array 10, a Y-selector 17, a sense amplifier 18, a reference cell decoder 103, a reference cell array 104, a reference selector QR1, a reference amplifier 19, a comparator-amplifier 20, and an output buffer 21.

The first address buffer 11 receives an address signal Ai (i=0 to 9), and transmits an internal address signal Adi (i=0 to 9) to the ATD circuit 13 and the Y-decoder 15. The second address buffer 12 receives an address signal Ai (i=10 to 19), and transmits an internal address signal Adi (i=10 to 19) to the ATD circuit 13 and the X-decoder 16.

On receipt of the internal address signals Adi from the first and second address buffers 11 and 12, the ATD circuit 13 detects variance in the address signals, and transmits a address-transition detecting signal P0 to the first and second signal-generating circuits 14 and 101.

The first signal generating circuit 14 receives the address-transition detecting signal P0 from the ATD circuit 13, and transmits a control signal P1 in the form of a one-shot pulse to the sense amplifier 18 and the reference amplifier 19. Operation of the sense amplifier 18 and the reference amplifier 19 is controlled by the control signal P1.

The second signal generating circuit 101 receives the address-transition detecting signal P0 from the ATD circuit 13, and transmits a control signal P2 in the form of a one-shot pulse to the counter circuit 102.

The counter circuit 102 counts the number of the received control signals P2, and accordingly transmits a control signal C1 to C4 to the reference cell decoder 103 to control the same.

The X-decoder 16 decodes the received internal address signals Ad10 to Ad19 for selecting one of word lines W0 to Wm. The X-decoder 16 transmits its output signal to one of the word lines W0 to Wm for selecting a word line. A voltage VR is applied to the selected word line.

The Y-decoder 15 decodes the received internal address signals Ad0 to Ad9 for selecting one of digit lines D0 to Dn. The Y-decoder 15 transmits its output signal to one of Y-select lines Y0 to Yn for selecting a Y-select line. A voltage VY is applied to the selected Y-select line.

The memory cell array 10 includes n×m memory cells MC00 to MCnm arranged in a matrix. Each of the memory cells includes a gate electrically connected to an associated word line W0 to Wm, a drain electrically connected to a digit line D0 to Dn, and a source electrically connected to a node CS. The node CS to which sources of the memory cells are all electrically connected is kept at a ground (GND) voltage by a circuit (not illustrated) when data is read out of a memory cell.

The Y-selector 17 is comprised of MOSFETs QY0 to QYn each having a source electrically connected to each of the digit lines D0 to Dn, a drain electrically connected to an input node SC through which the Y-selector 17 is electrically connected to the sense amplifier 18, and a gate electrically connected to each of output lines Y0 to Yn through which the Y-decoder 15 transmits its output signal to the Y-selector 17.

The sense amplifier 18 detects a voltage at the node SC which varies in accordance with data stored in a selected memory cell, and amplifies the thus detected voltage, which is output as an output voltage SA.

The reference cell array 104 includes a plurality of reference cells MRO to MR15 each having a source electrically connected to a node RS, a drain electrically connected to a node DR through which the reference cell array 104 is electrically connected to a source of the reference selector QR1, and defining a reference digit line, and a gate electrically connected to each of reference word lines WR0 to WR15 extending from the reference cell decoder 103. A voltage VR is applied to a selected word line. The node RS is kept at a ground (GND) voltage by a circuit (not illustrated) when data is read out of a selected memory cell. Each of the reference cells is designed to have the same structure and characteristics as those of a memory cell arranged in the memory cell array 10.

The reference selector QR1 is comprised of a MOSFET having a drain electrically connected to a node RC through which the reference selector QR1 is electrically connected to the reference amplifier 19, a gate electrically connected to a reference cell selection signal line YR, and a source electrically connected to the node DR.

A voltage equal to the voltage VY applied to a selected Y-selector line is applied to the reference cell selection signal line YR.

The reference cell decoder 103 receives an output C1 to C4 transmitted from the counter circuit 102, and decodes the output for selecting one of the reference word lines WR0 to WR15. The voltage VR is applied to the thus selected reference word line.

The reference amplifier 19 amplifies a voltage at the node RC, and outputs the thus amplified voltage as an output voltage RA.

The comparator-amplifier 20 amplifies a voltage difference between the output voltage SA transmitted from the sense amplifier 18 and the output voltage RA transmitted from the reference amplifier 19. The comparator-amplifier 20 judges whether a selected memory cell is in data-writing condition (0) or in data-erasing condition (1).

The output buffer 21 receives an output transmitted from the comparator-amplifier 20, and outputs data about a memory cell to an external data bus through an external output terminal I/O 0.

Figure 3:
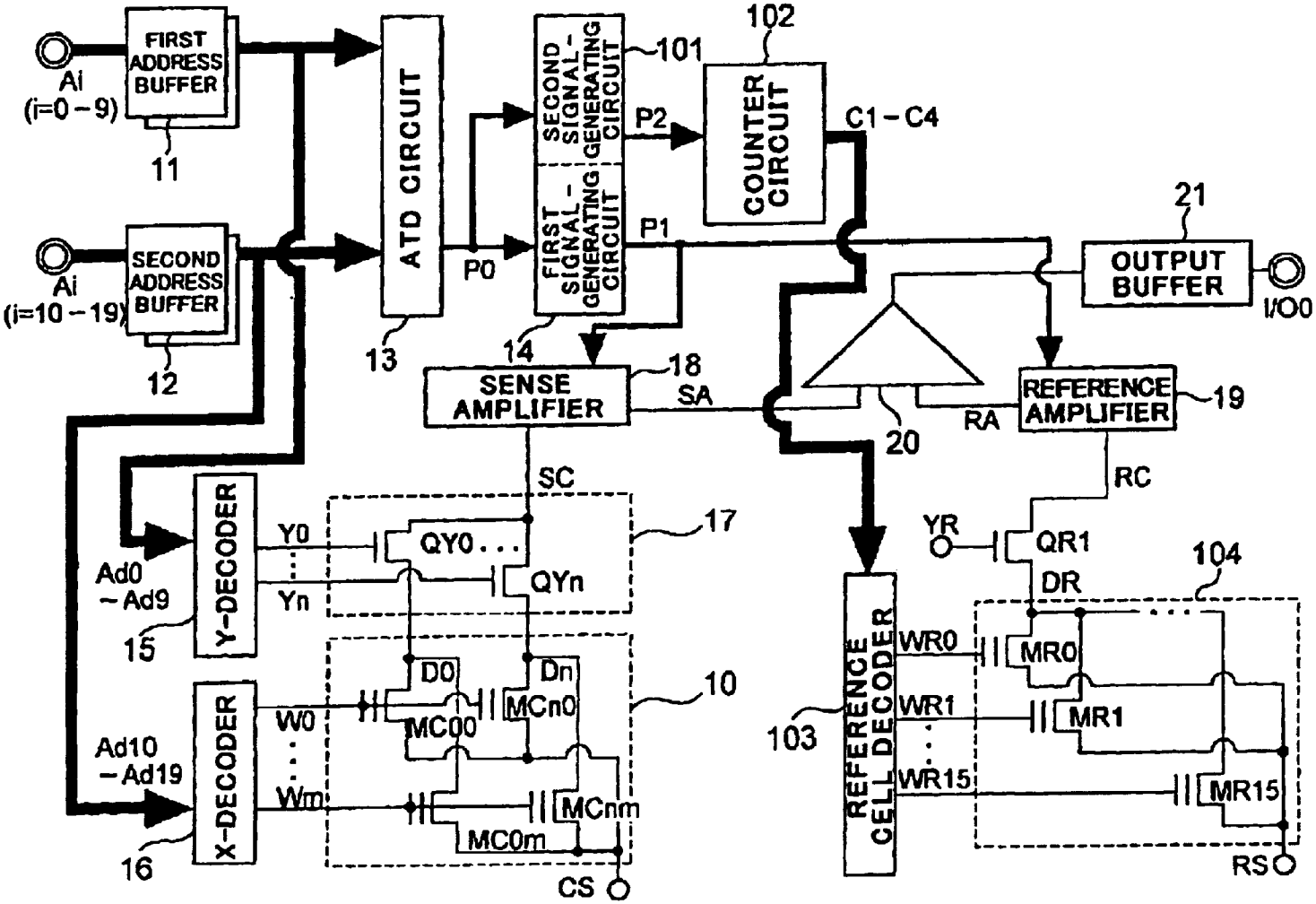
FIG. 3 is a block diagram of a semiconductor memory device in accordance with the first embodiment of the present invention.

The actual semiconductor memory device actually has sixteen external output terminals I/O 0 to I/O 15 when the semiconductor memory device is designed to transmit a 16-bit output, for instance, and has sixteen sense amplifiers, memory cell arrays and comparator-amplifiers, accordingly. However, FIG. 3 illustrates only the external output terminal I/O 0 and its associated parts, and other external output terminals I/O 1 to I/O 15 and their associated parts are omitted for simplification. In addition, a control system and a power source system are omitted, because they have nothing to do with the present invention.

FIGS. 4 to 7 illustrate examples of the circuits which are parts of the semiconductor memory device in accordance with the first embodiment.

Figure 4:
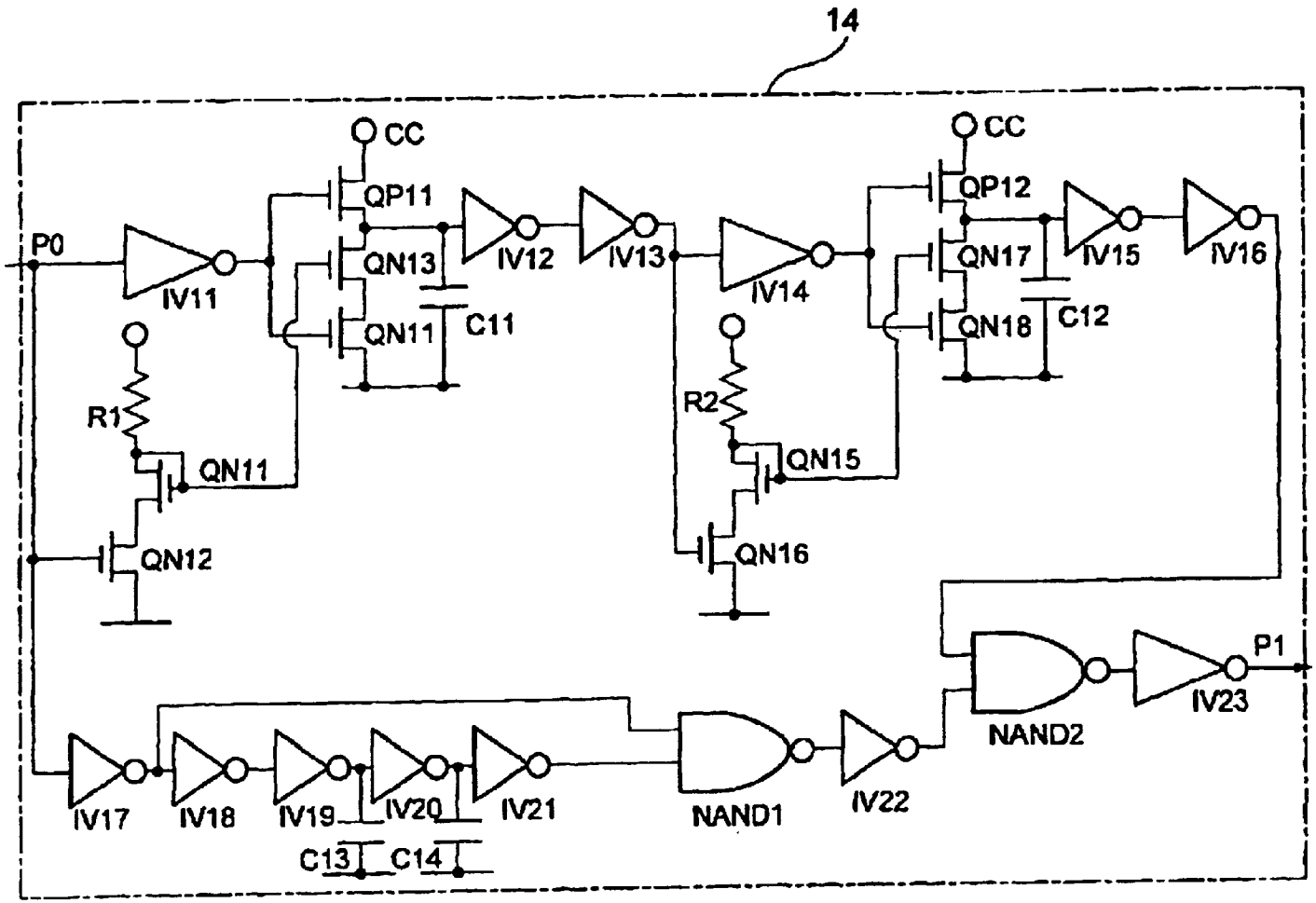
FIG. 4 is a block diagram of an example of the first signal-generating circuit which is a part of the semiconductor memory device in accordance with the first embodiment.

FIG. 4 is a block diagram of an example of the first signal-generating circuit 14.

The first signal-generating circuit 14 includes inverter circuits IV11 to IV23, NAND circuits NAND1 and NAND2, n-channel MOSFETs QN11 to QN18, p-channel MOSFETs QP11 and QP12, resistances R1 and R2, and capacitors C11 to C14.

The first signal-generating circuit 14 receives the address-transition detecting signal P0 from the ATD circuit 13, and transmits the control signal P1 by which the sense amplifiers 18 and the reference amplifier 19 are activated.

The first signal-generating circuit 14 delays the received address-transition detecting signal P0 until data stored in a memory cell and data stored in a reference cell are transmitted to the sense amplifier 18 and the reference amplifier 19, respectively, and transmits a control signal P1 as a pulse signal having a time width sufficient to amplify those data in the sense amplifier 18 and the reference amplifier 19. Hence, on receipt of the control signal P1, the sense amplifier 18 and the reference amplifier 19 are activated.

Figure 5:
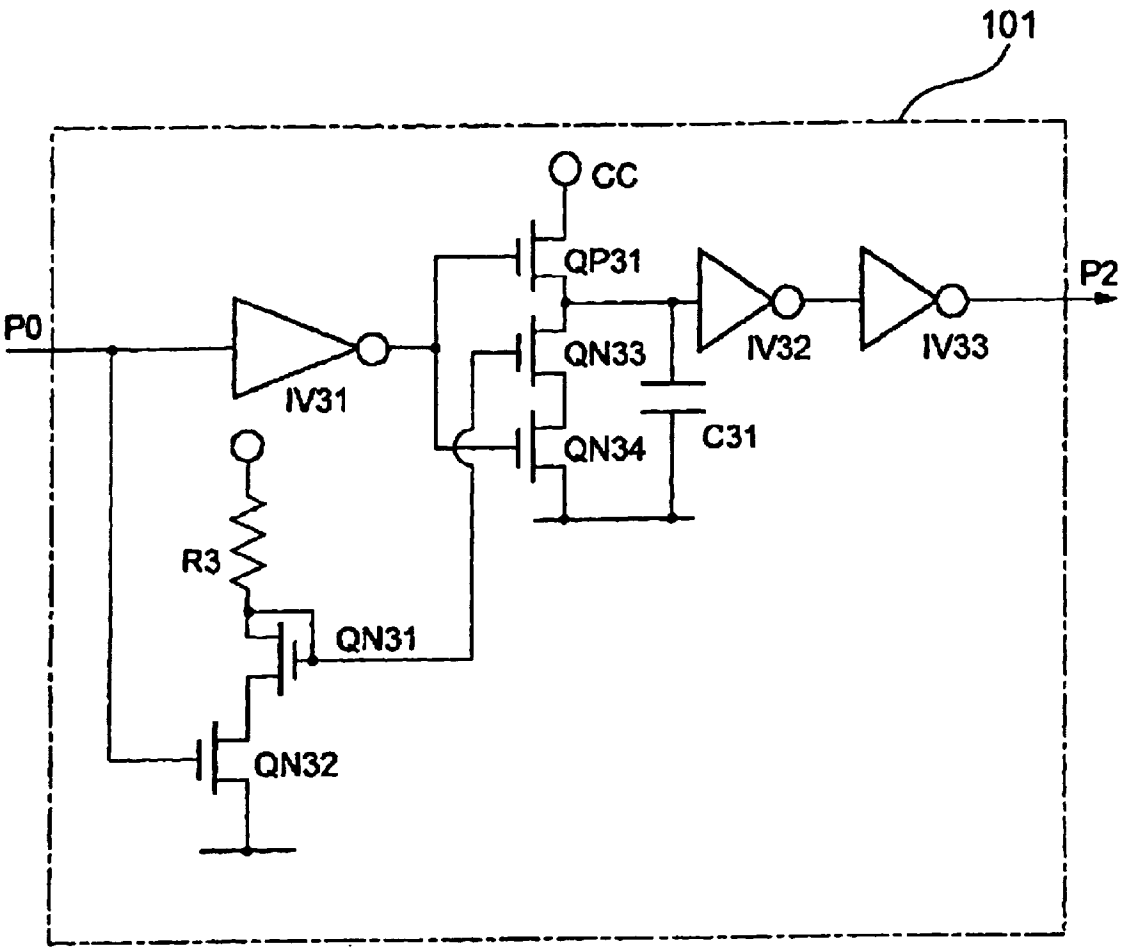
FIG. 5 is a block diagram of an example of the second signal-generating circuit which is a part of the semiconductor memory device in accordance with the first embodiment.

FIG. 5 is a block diagram of an example of the second signal-generating circuit 15.

The second signal-generating circuit 101 is comprised of inverter circuits IV31 to IV33, n-channel MOSFETs QN31 to QN34, a p-channel MOSFET QN31, a resistance R3, and a capacitor C31.

The second signal-generating circuit 101 receives the address-transition detecting signal P0 from the ATD circuit 13, and transmits the control signal P2, which is counted in the counter circuit 102.

The control signal P2 transmitted from the second signal-generating circuit 101 is a pulse signal, and has a pulse width having a leading edge synchronized with the address-transition detecting signal P0 and a trailing edge delayed until the counter circuit 102 and the reference cell decoder 103 are activated at a trailing edge of the address-transition detecting signal P0. In brief, the control signal P2 is designed to have a predetermined pulse width to control a time at which the reference cell decoder 13 is to be activated.

Figure 6:
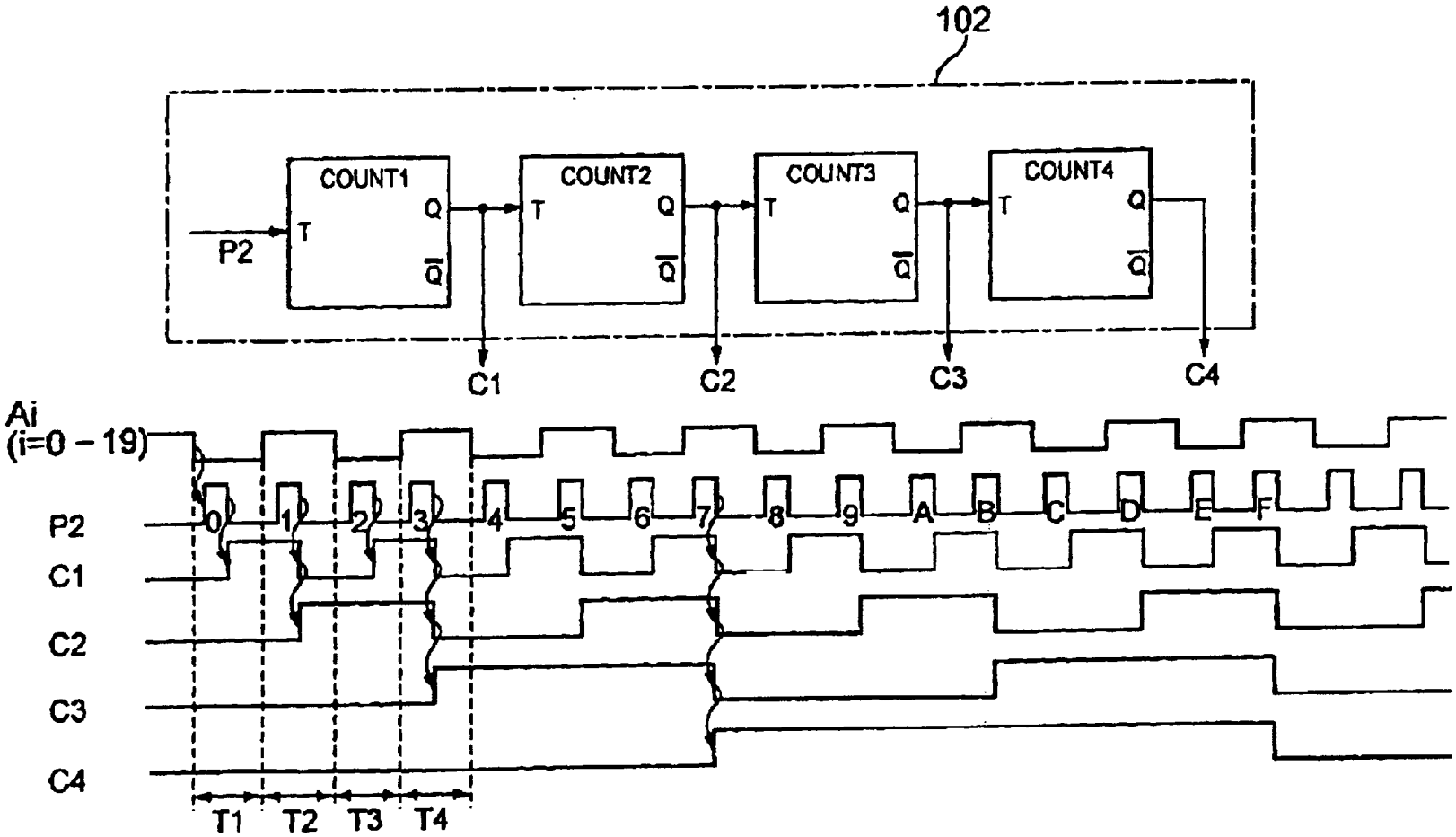
FIG. 6 is a block diagram of an example of the counter circuit which is a part of the semiconductor memory device in accordance with the first embodiment, and illustrates waveforms of signals used for operating the counter circuit.

FIG. 6 is a block diagram of an example of the counter circuit 102, and illustrates waveforms of signals used for operating the counter circuit 102.

The counter circuit 102 is comprised of a T-type flip-flop having first to fourth stages COUNT 1, COUNT 2, COUNT 3 and COUNT 4. The first to fourth stages transmit their outputs C1, C2, C3 and C4, respectively.

The first stage COUNT 1 receives the control signal P2 from the second signal-generating circuit 101, and transmit an output C1. The second stage COUNT 2 receives the output C1, and transmits an output C2. The third stage COUNT 3 receives the output C2, and transmits an output C3. The fourth stage COUNT 4 receives the output C3, and transmits an output C4.

The counter circuit 102 operates as follows.

If the input address signal Ai varies during a first reading-out cycle T1, the ATD circuit 13 detects the address transition, and transmits the address-transition detecting signal P0 to the second signal-generating circuit 101. Then, on receipt of the address-transition detecting signal P0, the second signal-generating circuit 101 transmits the control signal P2 as a short pulse 0.

Due to a level change in the control signal P2 from a high level to a low level, the first stage COUNT 1 transmits the output C1 having a high level in place of an output C1 having a low level.

Then, if the input address signal Ai varies during a second reading-out cycle T2, the second signal-generating circuit 101 transmits the control signal P2 as a short pulse 1. Due to a level change in the control signal P2 from a high level to a low level, the first stage COUNT 1 transmits the output C1 having a low level in place of an output C1 having a high level. Furthermore, due to a level change in the output C1 from a high level to a low level, the second stage COUNT 2 transmits the output C2 having a high level in place of an output C2 having a low level.

Then, if the input address signal Ai varies during a third reading-out cycle T3, the second signal-generating circuit 101 transmits the control signal P2 as a short pulse 2. Due to a level change in the control signal P2 from a high level to a low level, the first stage COUNT 1 transmits the output C1 having a high level in place of an output C1 having a low level.

Then, if the input address signal Ai varies during a fourth reading-out cycle T4, the second signal-generating circuit 101 transmits the control signal P2 as a short pulse 3. Due to a level change in the control signal P2 from a high level to a low level, the first stage COUNT 1 transmits the output C1 having a low level in place of an output C1 having a high level. Furthermore, due to a level change in the output C1 from a high level to a low level, the second stage COUNT 2 transmits the output C2 having a low level in place of an output C2 having a high level. Furthermore, due to a level change in the output C2 from a high level to a low level, the third stage COUNT 3 transmits the output C3 having a high level in place of an output C3 having a low level.

As mentioned above, since the counter circuit 102 is comprised of a T-type flip-flop circuit having four stages electrically connected in series to one another, if each of the stages receives an output, transmitted from the previous stage, having a low level in place of an output having a high level, each of the stages transmits an inverted logical output. Accordingly, by monitoring the outputs C1 to C4 transmitted from the first to fourth stages COUNTs 1 to 4, the number of pulses in the control signal P2 can be counted.

For instance, the four-bit outputs C1 to C4 makes it possible to identify 0 to 15. The first pulse 0 in the control signal P2 makes (C4, C3, C2, C1) equal to (0, 0, 0, 1), and the second pulse 1 makes (C4, C3, C2, C1) equal to (0, 0, 1,0). Similarly, the fifteenth pulse E in the control signal P2 makes (C4, C3, C2, C1) equal to (1, 1, 1, 1), and the sixteenth pulse F in the control signal P2 makes (C4, C3, C2, C1) equal to (0, 0, 0, 0). The number of pulses is counted in the above-mentioned way.

Figure 7:
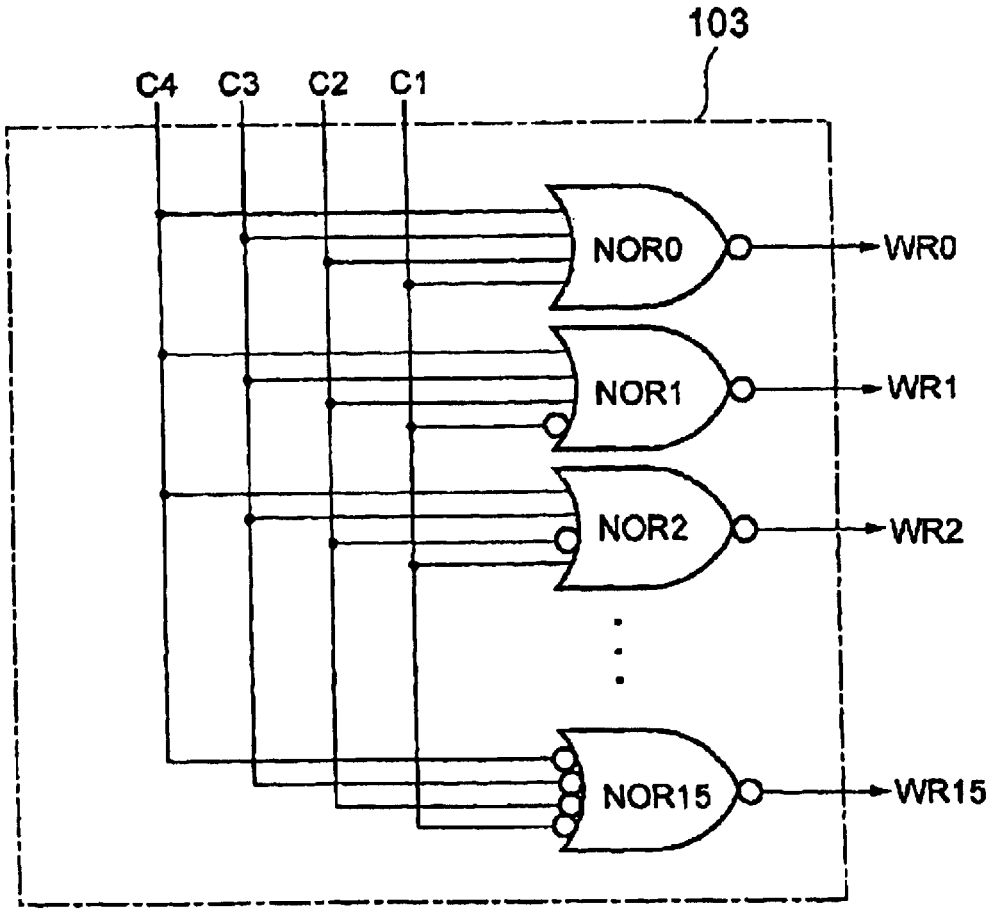
FIG. 7 is a block diagram of an example of the reference cell decoder which is a part of the semiconductor memory device in accordance with the first embodiment.

FIG. 7 is a block diagram of an example of the reference cell decoder 103.

The outputs C1, C2, C3 and C4 transmitted from the counter circuit 102 are input into first to sixteenth NOR circuits NOR0 to NOR15. The NOR circuits NOR0 to NOR15 transmits outputs WR0 to WR15 to the gates of the reference cells MR0 to MR15, respectively.

When (C4, C3, C2, C1) is equal to (0, 0, 0, 0), the first NOR circuit NOR0 transmits an output WR0 having a high level, and hence, the reference cell MR0 receiving the output WR0 is selected. When (C4, C3, C2, C1) is equal to (0, 0, 0, 1), the second NOR circuit NOR1 transmits an output WR1 having a high level, and hence, the reference cell MR1 receiving the output WR1 is selected. Similarly, when (C4, C3, C2, C1) is equal to (1, 1, 1, 1), the sixteenth NOR circuit NOR15 transmits an output WR15 having a high level, and hence, the reference cell MR15 receiving the output WR15 is selected.

Figure 8:
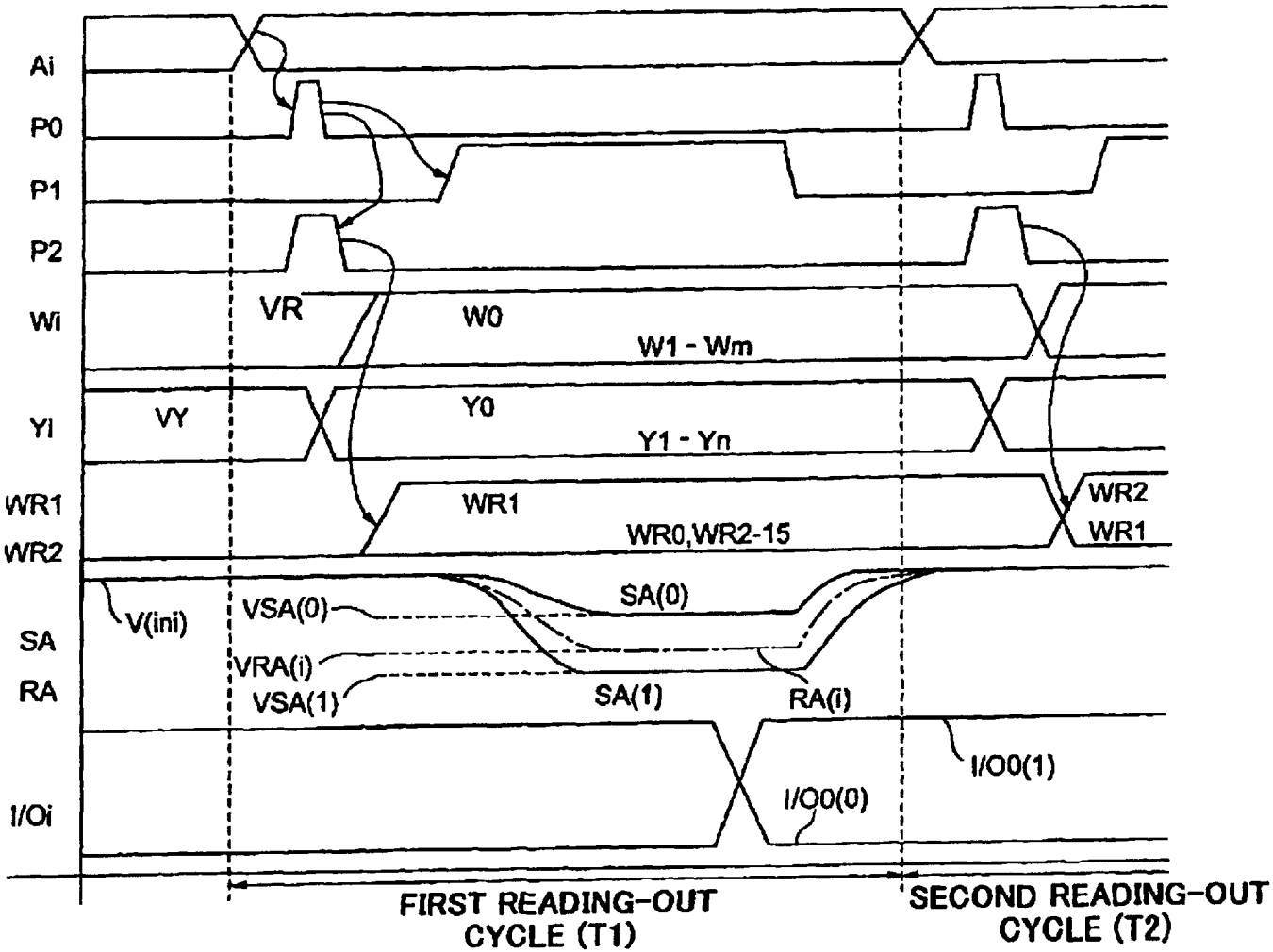
FIG. 8 illustrates waveforms of signals used for operating the semiconductor memory device in accordance with the first embodiment.

FIG. 8 illustrates waveforms of signals used for operating the semiconductor memory device in accordance with the first embodiment, illustrated in FIG. 3. Symbols in FIG. 8 correspond to the nodes and signals illustrated in FIG. 3.

A data-reading operation in the semiconductor memory device is explained hereinbelow with reference to FIGS. 3 to 8. It is assumed that a memory cell MC00 is first selected, and then, a memory cell MC11 is selected.

In the first reading-out cycle T1, when the ATD circuit 13 detects variance in the address signal Ai, the ATD circuit 13 transmits the address-transition detecting signal P0 to the first and second signal-generating circuits 14 and 101. Then, the first and second signal-generating circuits 14 and 101 transmit pulses illustrated in FIG. 8 as the control signals P1 and P2.

The control signal P2 has a first logic level or a high level (see FIG. 8) by virtue of the address-transition detecting signal P0, and the first logic level is varied to a second logic level at a time at which a word line in a reference cell is to be activated. That is, in synchronization with variance in a level of the control signal P2 from a high level to a low level, the outputs (C4, C3, C2, C1) transmitted from the counter circuit 102 is equal to (0, 0, 0, 1). As a result, the second NOR circuit NOR1 is selected, and the second NOR circuit NOR1 transmits an output WR1 having a high level. Thus, a reference cell MR1 is selected.

In addition, the address signal Ai is decoded in the Y-decoder 15 and the X-decoder 16, and a signal having a high level is transmitted to the selected Y-select line Y0 and the selected word line W0. As a result, a memory cell MC00 is selected.

As mentioned above, the control signal P2 is input into the counter circuit 102, and determines a time at which a word line in a reference cell is to be activated. When a level of the control signal P1 transmitted from the first signal-generating circuit 14 is varied to a high level from a low level, the sense amplifier and the reference amplifier 19 are activated.

If the memory cell MC00 is in the data-writing condition (0), the memory cell MC00 does not allow a current to run therethrough, and resultingly, a voltage of the output SA transmitted from the sense amplifier 18 is lowered to a balanced voltage VSA(0) from an initial voltage V(ini), as shown in FIG. 8 with a waveform of a voltage SA(0).

On the other hand, the reference cell MR1 allows a current to slightly run therethrough, and resultingly, a voltage of the output RA transmitted from the reference amplifier 19 is lowered to a balanced voltage VRA(i) from the initial voltage V(ini), as shown with a waveform of a voltage RA(i).

A voltage difference between the voltages VSA(0) and VRA(i) is amplified in the comparator-amplifier 20, and then, data stored in the memory cell is judged to be in the data-writing condition (0).

The comparator-amplifier 20 transmits its output to the output buffer 21, and the output buffer 21 transmits an output signal having a low (L) level to an external output terminal I/Oi, as shown in FIG. 8 with a waveform of a voltage I/O 0(0).

If the selected memory cell MC00 is in the data-erasing condition (1), the memory cell MC00 allows a current to run therethrough, and resultingly, a voltage of the output SA transmitted from the sense amplifier 18 is lowered to a balanced voltage VSA(1) from the initial voltage V(ini), as shown in FIG. 8 with a waveform of a voltage SA(1).

On the other hand, the reference cell MR1 allows a current to slightly run therethrough, and resultingly, a voltage of the output RA transmitted from the reference amplifier 19 is lowered to a balanced voltage VRA(i) from the initial voltage V(ini), as shown in FIG. 8 with a waveform of a voltage RA(i).

A voltage difference between the voltages VSA(1) and VRA(i) is amplified in the comparator-amplifier 20, and then, data stored in the memory cell is judged to be in the data-erasing condition (1).

The comparator-amplifier 20 transmits its output to the output buffer 21, and the output buffer 21 transmits an output signal having a high (H) level to an external output terminal I/Oi, as shown in FIG. 8 with a waveform of a voltage I/O 0(1).

In the second reading-out cycle T2, when the memory cell MC11 is selected by the address signal Ai, the ATD circuit 13 detects variance in the address signal Ai, and transmits the address-transition detecting signal P0 to the first an second signal-generating circuits 14 and 101. In response, the first an second signal-generating circuits 14 and 101 transmit pulses illustrated in FIG. 8 as the control signals P1 and P2, respectively.

Due to variance in level of the control signal P2 from a high level to a low level, the outputs (C4, C3, C2, C1) transmitted from the counter circuit 102 becomes (0, 0, 1, 0). As a result, the third NOR circuit NOR2 is selected in the reference cell decoder 103, and a level of a signal transmitted to the word line WR1 is varied to a low level from a high level, and a level of a signal transmitted to the word line WR2 is varied to a high level from a low level. Thus, a reference cell MR2 is selected.

The address signal Ai in the second reading-out cycle T2 is decoded in the Y-decoder 15 and the X-decoder 16, and data stored in the selected memory cell MC11 identified by the selected Y-select line Y1 and the selected word line W1 is output to the external output terminal I/Oi, similarly to the operation of MC00.

As mentioned above, the reference cell MR1 is selected in the first reading-out cycle T1, and the reference cell MR2 is selected in the second reading-out cycle T2. Namely, reference cells are selected in turn every different reading-out cycles. In the sixteenth reading-out cycle T16, the reference cell MR0 is selected. After all of the reference cells have been selected, the reference cell MR1 is selected again in the seventeenth reading-out cycle T17.

In the first embodiment, the counter circuit 102 is designed to have the first to fourth stages, and the sixteen reference cells are switched one by one in accordance with the outputs C1 to C4 transmitted from the first to fourth stages. As a variant, the counter circuit 102 may be designed to have five stages for selecting one of thirty-two reference cells. As an alternative, a reference cell may be selected among a plurality of reference cells every predetermined number of reading-out cycles. For instance, a reference cell may be selected among sixteen reference cells every two reading-out cycles in accordance with outputs C1 to C5 transmitted from five stages of the counter circuit 102.

As explained so far, the semiconductor memory device in accordance with the first embodiment is designed to include a plurality of reference cells to which a reference voltage is applied, and a reference cell is selected among a plurality of reference cells every reading-out cycle. Hence, the semiconductor memory device in accordance with the first embodiment makes it possible to reduce a stress which an electric field exerts on a reference cell when data is read out of a memory cell, in comparison with the conventional semiconductor memory device.

Since the semiconductor memory device in accordance with the first embodiment includes sixteen reference cells, a stress exerted on a single reference cell is reduced 1/16 times. Accordingly, even after the semiconductor memory device has been operated for sixteen years, each of reference cells is degraded to a degree corresponding to only one-year degradation. Hence, the reference voltage VR is kept almost equal to the initial voltage VRA(i), ensuring a sufficient voltage difference between an initial voltage VRA and a balanced voltage VSA. Accordingly, the semiconductor memory device does not wrongly operate.

[Second Embodiment]

Figure 9:
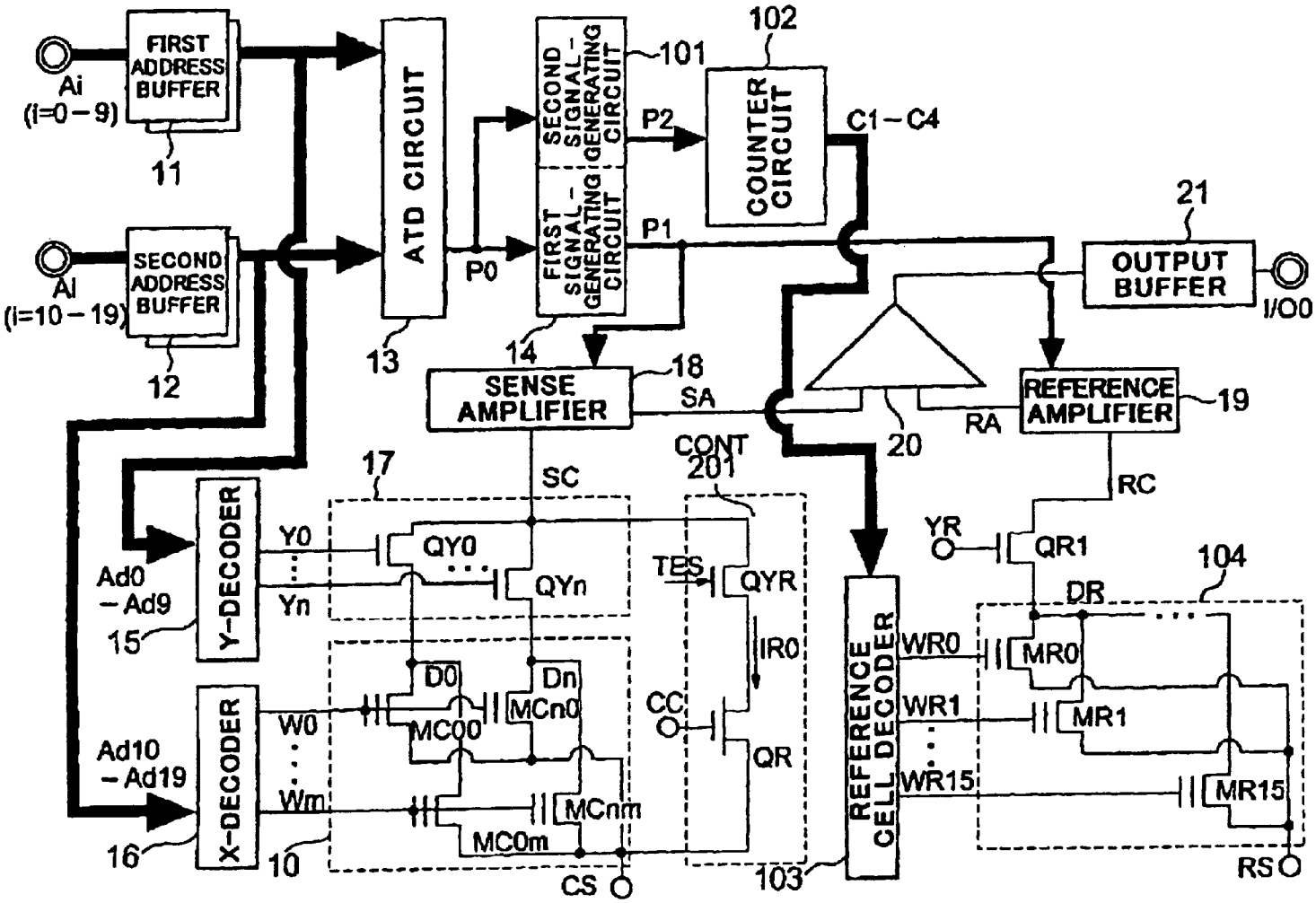
FIG. 9 is a block diagram of a semiconductor memory device in accordance with the second embodiment of the present invention.

FIG. 9 is a block diagram of a semiconductor memory device in accordance with the second embodiment. Parts or elements that correspond to those of the first embodiment have been provided with the same reference numerals, and will not be explained.

The semiconductor memory device in accordance with the second embodiment is designed to additionally include an additional circuit CONT201 in comparison with the semiconductor memory device in accordance with the first embodiment.

The additional circuit CONT201 is comprised of a first MOSFET QYR and a second MOSFET QR. The first MOSFET QYR has a drain electrically connected to the node SC, a gate receiving a signal TES, and a source electrically connected to a drain of the second MOSFET QR. The second MOSFET QR has a drain electrically connected to a source of the first MOSFET QYR, a gate electrically connected to a power source CC, and a source electrically connected to the internal node CS.

The semiconductor memory device in accordance with the second embodiment is designed to carry out a test mode in which a current IR0 running through the second MOSFET QR is compared to a current running through a reference cell, thereby a current necessary for driving the reference cells MR0 to MR15 is uniformized.

In the test mode, the signal TES has a high level, the Y-decoder 15 and the X-decoder 16 are kept inactive, a signal having a low level is applied to the Y-select lines Y0 to Yn and the word lines W0 to Wm, and memory cells in the memory cell array 10 are not selected. Instead, the signal TES as the voltage VY is applied to a gate of the first MOSFET QYR and the power source CC is electrically connected to a gate of the second MOSFET QR, that is, the additional circuit CONT201 is selected, and hence, is electrically connected to the sense amplifier 18.

The voltage VSA of the output SA transmitted from the sense amplifier 18 is predetermined by the current IRO.

Then, the reference cells MR0 to MR15 are selected in turn, and data-writing or data-erasing is carried out. After data-writing or data-erasing has been carried out, an output at the external output terminal I/O 0 is monitored. Until an output at the external output terminal I/O 0 varies from its initial voltage, data-writing or data-erasing continues to be carried out.

For instance, it is assumed that a reference cell MR0 is selected for data-reading. If an output transmitted through the external output terminal I/O 0 has a high level, it means a current running through the selected reference cell MR0 is smaller than the current IR0 running through the second MOSFET QR. Hence, data read out of the reference cell MR0 is erased. Then, the reference cell MR0 is selected again for data-reading. If an output transmitted through the external output terminal I/O 0 has a low level, it means a current running through the selected reference cell MR0 is almost equal to the current IR0 running through the second MOSFET QR. Hence, the test mode ends.

In contrast, if an output transmitted through the external output terminal I/O 0 still has a high level, data read out of the reference cell MR0 is erased again. Steps of erasing data and reading data out of the reference cell MR0 are repeatedly carried out until an output transmitted through the external output terminal I/O 0 has a low level. A period of time during which data read out of the reference cell MR0 is erased is set sufficient for slightly adjusting a current running through the reference cell MR0.

In the test mode, the address signal Ai remains unchanged until an output transmitted through the external output terminal I/O 0 is inverted. When the output was inverted, another address signal is input into the first and second address buffers 11 and 12. On receipt of another address signals Ai by the first and second address buffers 11 and 12, the ATD circuit 13 transmits the address-transition detecting signal P0, and then, the second signal-generating circuit 101 transmits the control signal P2. As a result, the count in the counter circuit 102 varies, and thus, a next reference cell MR1 is selected. A current running through the reference cell MR1 is adjusted in the same manner as mentioned above.

The semiconductor memory device in accordance with the second embodiment operates in the same way as that of the first embodiment except an operation of the additional circuit CONT201 which equalizes a current running through each of the reference cells, to one another. Hence, the semiconductor memory device in accordance with the second embodiment provides the same advantages as those provided by the first embodiment, and provides an additional advantage that a current running through each of a plurality of reference cells can be set equal to a predetermined current such as the above-mentioned current IR0, ensuring stable operational margin.

The additional circuit CONT201 may be differently constructed from the above-mentioned one. For instance, the second MOSFET transistor QR may be replaced with a memory device having the same threshold as that of a reference cell, ensuring that a threshold of a reference cell can be controlled. As an alternative, the second MOSFET transistor QR may be replaced with a resistance, ensuring an on-resistance and off-resistance of a reference cell can be controlled. The additional circuit CONT201 may be applied to a later mentioned ferroelectric memory device, making it possible to control electric characteristics of a reference cell such as a threshold voltage, an on-current, an off-current, an on-resistance, an off-resistance, an inverted threshold magnetic field, and polarization (polarized electric field and capacity).

[Third Embodiment]

Figure 10A:
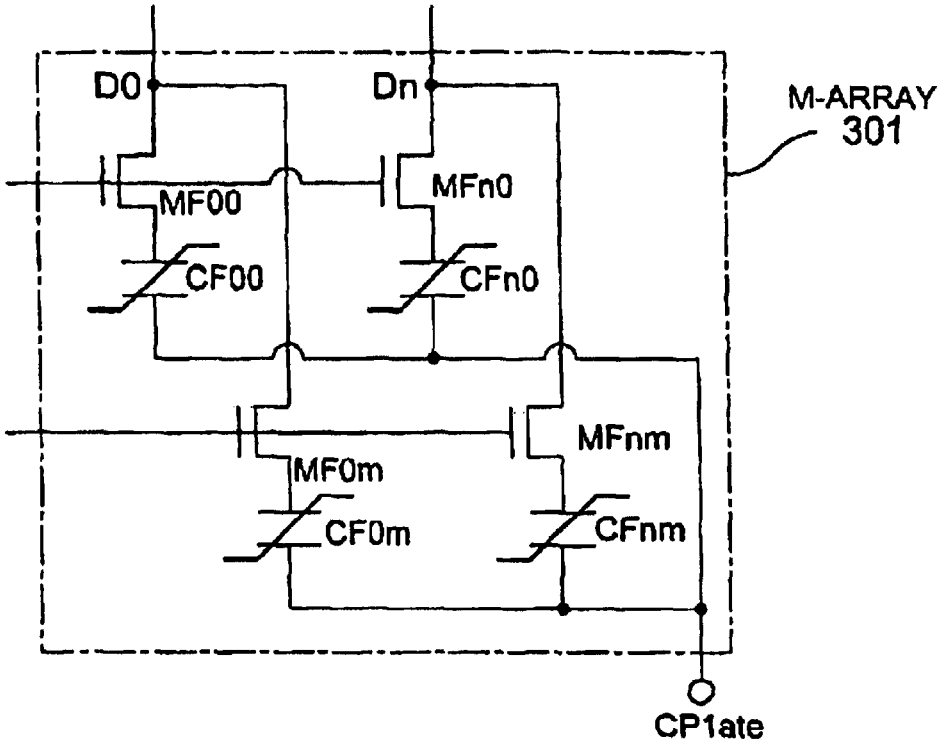
FIG. 10A is a block diagram of the memory cell array which is a part of the semiconductor memory device in accordance with the third embodiment.
Figure 10B:
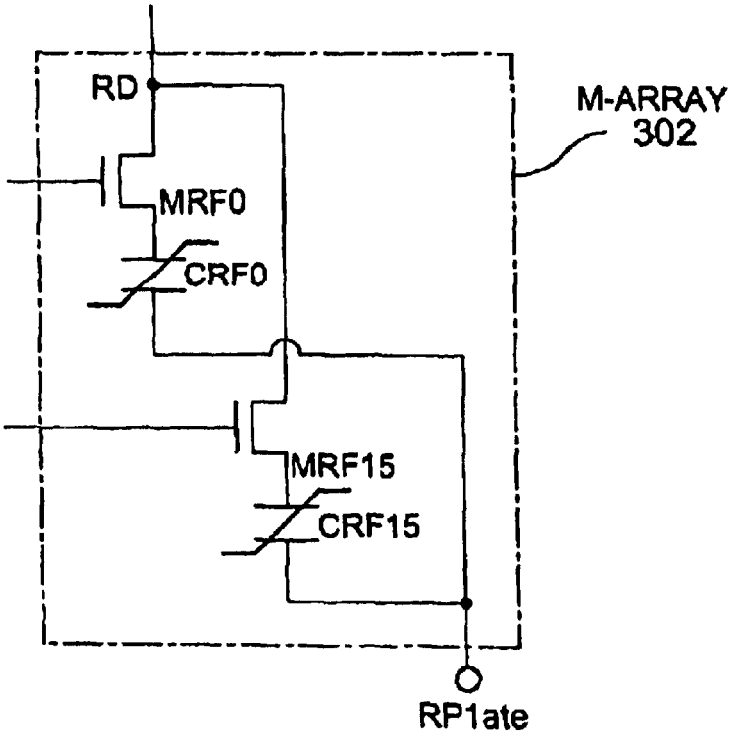
FIG. 10B is a block diagram of the reference cell which is a part of the semiconductor memory device in accordance with the third embodiment.

FIG. 10A is a block diagram of a memory cell array as a part of a semiconductor memory device in accordance with the third embodiment, and FIG. 10B is a block diagram of a reference cell array as a part of the semiconductor memory device.

The semiconductor memory device in accordance with the third embodiment has the same structure as that of the first or second embodiment except that the memory cell array 10 is replaced with the memory cell array 301 illustrated in FIG. 10A, the reference cell array 104 is replaced with the reference cell array 302 illustrated in FIG. 10B, and the nodes CS and RS are electrically connected to CPlate and RPlate, respectively.

The memory cell array 301 is comprised of ferroelectric capacity devices CF00 to CFnm and selectively controlled MOSFETs MF00 to MFnm. The reference cell array 302 is comprised of ferroelectric capacity devices CRF0 to CRF15 and selectively controlled MOSFETs MRF0 to MRF15.

The semiconductor memory device in accordance with the third embodiment is comprised of a ferroelectric memory such as FeRAM, and thus, each of a memory cell and a reference cell is comprised of a ferroelectric capacity device and a selectively controlled MOSFET.

Each of the ferroelectric capacity devices CF00 to CFnm in the memory cell array 301 is electrically connected at one end to an associated selectively controlled MOSFET MF00 to MFnm, and at the other end to a plate line CPlate. Similarly, each of the ferroelectric capacity devices CRF0 to CRF15 in the reference cell array 302 is electrically connected at one end to an associated selectively controlled MOSFET MRF0 to MRF15, and at the other end to a plate line RPlate.

Each of the selectively controlled MOSFETs MF00 to MFnm and MRF0 to MRF15 has a gate electrically connected to a word line, a drain electrically connected to a digit line, and a source electrically connected to an associated ferroelectric capacity device.

Characteristics of the ferroelectric capacity devices such as polarization are varied by a voltage or an electric field applied thereto. Accordingly, similarly to a flash EEPROM, an electric field exerts a stress on a reference cell during a lot of data-reading, resulting in variance in characteristics of a ferroelectric capacity device. By applying the first and/or second embodiment(s) to the ferroelectric memory device in accordance with the third embodiment, it would be possible to prevent degradation of a reference cell, and ensure a highly qualified ferroelectric memory device.

[Fourth Embodiment]

Figure 11:
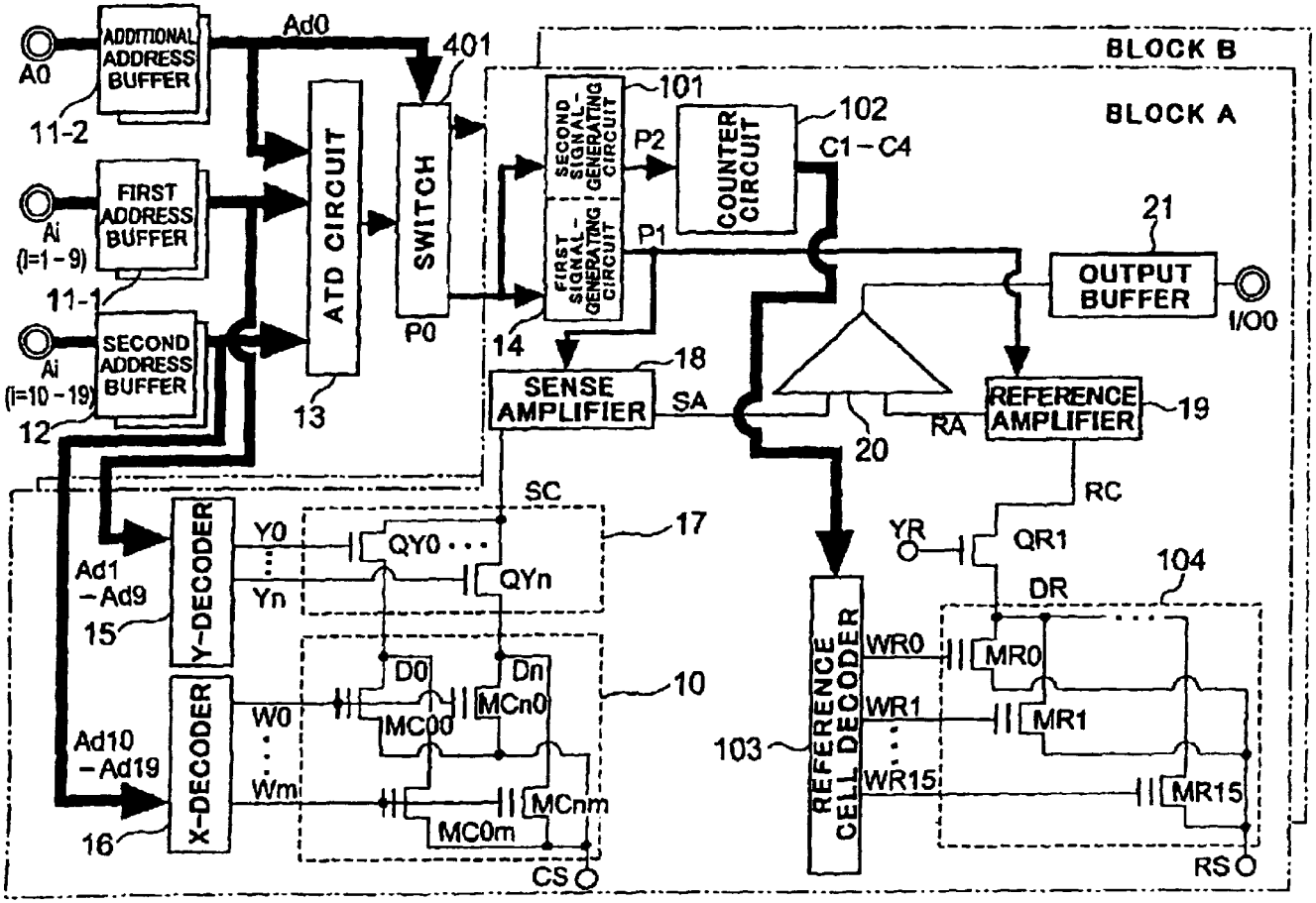
FIG. 11 is a block diagram of a semiconductor memory device in accordance with the fourth embodiment of the present invention.

FIG. 11 is a block diagram of a semiconductor memory device in accordance with the fourth embodiment. Parts or elements that correspond to those of the first embodiment have been provided with the same reference numerals, and will not be explained.

The semiconductor memory device in accordance with the fourth embodiment is designed to be comprised of a plurality of blocks. Specifically, the semiconductor memory device is divided into two blocks, a first block A and a second block B. The first and second blocks A and B are switched to each other by an internal address signal Ad0. The internal address signal Ad0 is not input into the Y-decoder 15. The Y-decoder 15 receives the internal address signals Ad1 to Ad9, and accordingly, totally 512 Y-select fines Y0 to Yn (n=512) extend from the Y-decoder 15.

The first block A has a capacity equal to a half of a capacity of the semiconductor memory device in accordance with the first embodiment, and similarly, the second block B has a capacity equal to a half of a capacity of the semiconductor memory device in accordance with the first embodiment. Namely, a total of capacities of the first and second blocks A and B is equal to a capacity of the semiconductor memory device in accordance with the first embodiment.

The semiconductor memory device in accordance with the third embodiment includes an additional address buffer 11-2 as well as the first address buffer 11-1 receiving address signals A1 to A9 and the second address buffer 12 receiving address signals A10 to A19. The semiconductor memory device further includes a switch 401 for selecting one of the first and second blocks A and B.

The additional address buffer 11-2 receives address signals A0, and transmits an output signal Ad0 to the ATD circuit 13 and the switch 401. The switch 401 selects either the first block A or the second block B in accordance with the received output signal Ad0. The switch 401 receives the address-transition detecting signal P0 from the ATD circuit 13, and transmits the address-transition detecting signal P0 to the selected block.

The selected block operates in the same way as that of the semiconductor memory in accordance with the first embodiment. For instance, in the selected block, the first and second signal-generating circuits 14 and 101 transmit the control signals P1 and P2, respectively, based on the received address-transition detecting signal P0. The non-selected block does not operate. Hence, in the non-selected block, the first and second signal-generating circuits 14 and 101 do not transmit the control signals P1 and P2, respectively.

In the third embodiment, the control signal P0 transmitted from the ATD circuit 13 is provided to the selected block through the switch 401. As an alternative, the first and second signal-generating circuits 14 and 101 and the counter circuit 102 may be arranged commonly to the first and second blocks A and B, in which case, the control signals P1 and P2 or the outputs C1 to C4 transmitted from the counter circuit 102 are provided only to the selected block.

In accordance with the third embodiment, the semiconductor memory device is designed to include a plurality of blocks each having a plurality of reference cells to which a reference voltage is to be applied. In each of the blocks, a reference cell is selected among a plurality of reference cells every reading-out cycle. Hence, it is possible to reduce a stress which an electric field exerts on a reference cell when data is read out of a memory cell, in comparison with the conventional semiconductor memory device.

In the above-mentioned embodiments, a flash EEPROM and a FeRAM are explained as embodiments of the present invention. However, it should be noted that the present invention may be applied to any semiconductor memory device, if it reads data out of a selected memory cell by comparing data stored in a reference cell to data stored in a memory cell, and further if it would have variance in its characteristics due to a lot of operations of a reference cell. For instance, the present invention may be applied to a MONOS device memory or a MRAM (magnetic memory).

Among characteristics of a reference cell in MONOS device memory, a threshold voltage of a reference cell, an on-current, an off-current, an on-resistance, and an off-resistance are important, similarly to a flash EEPROM in accordance with the first and second embodiments. Among characteristics of a reference cell in a MRAM, a coercive force and a threshold of an inverted magnetic field are important.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-249388 filed on Aug. 28, 2002 including specification, claims, drawings and summary is incorporated herein by reference in its entirety.

What is claimed is:

1. A semiconductor memory device comprising:

(a) a plurality of reference cells;

(b) a plurality of memory cells, data stored in a selected reference cell among said reference cells being compared to data stored in a selected memory cell among said memory cells;

(c) an address transition detector for detecting transition in input of addresses by which a memory cell is selected among said memory cells, and transmitting an address transition detecting signal indicative of the detected transition;

(d) a counter for counting said address transition detecting signals; and (e) a reference cell decoder for selecting a reference cell among said reference cells in accordance with an output transmitted from said counter.

2. The semiconductor memory device as set forth in claim 1, further comprising a control signal generator which transmits a control signal to said counter, said control signal having a first logic level when said control signal generator receives said address transition detecting signal from said address transition detector, and a second logic level at a time at which a reference word line is to be activated.

3. The semiconductor memory device as set forth in claim 1, wherein said selected reference cell is compared to said selected memory cell for checking data when data is read out of, written into or erased out of said memory cell, and at least one reference cell is selected among said reference cells every predetermined number of times of comparison of said selected reference cell to said selected memory cell.

4. The semiconductor memory device as set forth in claim 1, wherein said plurality of reference cells is arranged for each of memory cell arrays or for a plurality of memory cell arrays.

5. The semiconductor memory device as set forth in claim 1, further comprising means for allowing said reference cells to have desired electrical property.

6. The semiconductor memory device as set forth in claim 5, wherein said electrical property includes a threshold voltage, an on-current, an off-current, an on-resistance, an off-resistance, an inverted threshold magnetic field and polarization of said reference cell.

7. The semiconductor memory device as set forth in claim 1, wherein said counter includes a plurality of stages each transmitting an output signal by which a reference cell is selected among said plurality of reference cells.

8. The semiconductor memory device as set forth in claim 1, further comprising a circuit including a metal oxide semiconductor field effect transistor (MOSFET), and wherein a current running through said circuit is checked for allowing a common current to run through said reference cells.

9. The semiconductor memory device as set forth in claim 1, further comprising a circuit including a memory device having the same threshold as that of said reference cells for adjusting threshold of said reference cells.

10. The semiconductor memory device as set forth in claim 1, wherein said semiconductor memory device is comprised of a ferroelectric memory device, and said memory cells and said reference cells are comprised of ferroelectric capacitors and selectively controlled MOSFETs, respectively.

11. The semiconductor memory device as set forth in claim 1, wherein said semiconductor memory device includes a plurality of blocks one of which is selected in accordance with a received address signal.

12. The semiconductor memory device as set forth in claim 1, wherein said semiconductor memory device is comprised of a flash electrically erasable and programmable read only memory (EEPROM).

13. The semiconductor memory device as set forth in claim 1, wherein said semiconductor memory device is comprised of a MONOS memory.

14. The semiconductor memory device as set forth in claim 1, wherein said semiconductor memory device is comprised of a MRAM.

15. A method of selecting a reference cell among a plurality of reference cells in a semiconductor memory device including a plurality of memory cells and a plurality of reference cells, comprising:

detecting transition in input of addresses by which a memory cell is selected among said memory cells, and transmitting a pulse each time of detection;

counting said pulses; and selecting a desired reference cell among said reference cells in accordance with the number of said pulses.

*16. A semiconductor memory device comprising:*

(*a*) *a plurality of reference cells, each reference cell comprising a data-writing function and a data-erasing function, each reference cell having a same electric characteristic;*

(*b*) *a plurality of memory cells, data stored in a selected reference cell among said reference cells being compared to data stored in a selected memory cell among said memory cells;*

(*c*) *a counter for counting a number of access cycles; and*

(*d*) *a reference cell decoder for selecting a reference cell among said reference cells in accordance with an output of said counter.*

*17. The semiconductor memory device as set forth in claim 16, wherein said counter is controlled by an address signal.*

*18. The semiconductor memory device as set forth in claim 16, wherein the same electric characteristic is current, a threshold voltage, or polarization.*

*19. The semiconductor memory device as set forth in claim 16, wherein each of the of the plurality of reference cells comprises a structure identical to a structure of one of the plurality of memory cells.*

*20. A semiconductor memory device comprising:*

(*a*) *a plurality of reference cells, each reference cell comprising a data-writing function and a data-erasing function, each reference cell having a same electric characteristic;*

(*b*) *a plurality of memory cells, data stored in a selected reference cell among said reference cells being compared to data stored in a selected memory cell among said memory cells;*

(*c*) *a counter for counting a number of access cycles;*

(*d*) *a memory cell decoder for selecting a memory cell among said memory cells in response to an external address; and*

(*e*) *a reference cell decoder for selecting a reference cell among said reference cells in response to said number of access cycles.*

*21. The semiconductor memory device as set forth in claim 20, wherein said counter is controlled by an address signal.*

*22. The semiconductor memory device as set forth in claim 20, wherein the same electric characteristic is current, a threshold voltage, or polarization.*

*23. The semiconductor memory device as set forth in claim 20, wherein each of the of the plurality of reference cells comprises a structure identical to a structure of one of the plurality of memory cells.*

*24. A method of selecting a reference cell among a plurality of reference cells in a semiconductor memory device including a plurality of memory cells and a plurality of reference cells, comprising:*

*selecting a desired reference cell among said reference cells in accordance with a predetermined access cycle; and*

*deciding said predetermined access cycle to reduce a stress which an electric field exerts on the plurality of reference cells.*

* * * * *